United States Patent
Boissiere et al.

(10) Patent No.: US 10,053,795 B2
(45) Date of Patent: Aug. 21, 2018

(54) PROCESS FOR PREPARING AN EPITAXIAL ALPHA-QUARTZ LAYER ON A SOLID SUPPORT, MATERIAL OBTAINED AND USES THEREOF

(71) Applicants: CENTRE NATIONAL DE LA RECHERCHE SCIENTIFIQUE, Paris (FR); CONSEJO SUPERIOR DE INVESTIGACIONES CIENTIFICAS (CSIC), Madrid (ES); UNIVERSITE PIERRE ET MARIE CURIE (PARIS 6), Paris (FR)

(72) Inventors: Cedric Boissiere, Villebon sur Yvette (FR); Adrien Carretero-Genevrier, Paris (FR); Marti Gich, Barcelone (ES); David Grosso, Cheptainville (FR); Clement Sanchez, Bures sur Yvette (FR)

(73) Assignees: CENTRE NATIONAL DE LA RECHERCHE SCIENTIFIQUE, Paris (FR); CONSEJO SUPERIOR DE INVESTIGACIONES CIENTIFICAS (CSIC), Madrid (ES)

(*) Notice: Subject to any disclaimer, the term of this patent is extended or adjusted under 35 U.S.C. 154(b) by 345 days.

(21) Appl. No.: 14/416,098

(22) PCT Filed: Jul. 22, 2013

(86) PCT No.: PCT/FR2013/051766
§ 371 (c)(1),
(2) Date: Jan. 21, 2015

(87) PCT Pub. No.: WO2014/016506
PCT Pub. Date: Jan. 30, 2014

(65) Prior Publication Data
US 2015/0176149 A1 Jun. 25, 2015

(30) Foreign Application Priority Data

Jul. 23, 2012 (FR) ...................... 12 57101

(51) Int. Cl.
*C30B 1/00* (2006.01)
*C30B 1/02* (2006.01)
(Continued)

(52) U.S. Cl.
CPC ............... *C30B 1/023* (2013.01); *C30B 1/00* (2013.01); *C30B 1/026* (2013.01); *C30B 5/00* (2013.01);
(Continued)

(58) Field of Classification Search
CPC .. C30B 1/00; C30B 1/023; C30B 5/00; C30B 1/026; C30B 1/04
See application file for complete search history.

(56) References Cited

U.S. PATENT DOCUMENTS 5,174,801 A * 12/1992 Matsumura ........... C03B 19/095
65/144
6,028,020 A * 2/2000 Tanaka ..................... C30B 5/00
117/4
(Continued)

FOREIGN PATENT DOCUMENTS

JP          08213871        8/1996
JP          2004018291      1/2004
(Continued)

OTHER PUBLICATIONS

International Search Report dated 2013.

*Primary Examiner* — Matthew Song
(74) *Attorney, Agent, or Firm* — Ipsilon USA, LLP (57) ABSTRACT

The present invention relates to a process for preparing epitaxial α-quartz layers on a solid substrate, to the material
(Continued)

obtained according to this process, and to the various uses thereof, especially in the electronics field.

17 Claims, 5 Drawing Sheets

(51) Int. Cl.
    *C30B 5/00*     (2006.01)
    *C30B 29/18*     (2006.01)

(52) U.S. Cl.
    CPC ..... *C30B 29/18* (2013.01); *Y10T 428/249969* (2015.04)

(56) References Cited

U.S. PATENT DOCUMENTS

| | | | |
|---|---|---|---|
| 2002/0060319 A1 | 5/2002 | Takahashi et al. | |
| 2003/0094131 A1* | 5/2003 | Tsujimoto | C30B 15/10 117/95 |
| 2007/0138459 A1* | 6/2007 | Wong | B82Y 25/00 257/9 |

FOREIGN PATENT DOCUMENTS

| | | |
|---|---|---|
| JP | 2008273824 | 11/2008 |
| JP | 2012102016 | 5/2012 |
| WO | 2007141364 | 12/2007 |

\* cited by examiner

PROCESS FOR PREPARING AN EPITAXIAL ALPHA-QUARTZ LAYER ON A SOLID SUPPORT, MATERIAL OBTAINED AND USES THEREOF

RELATED APPLICATIONS

This application is a National Phase Application of PCT/FR2013/051766, filed on Jul. 22, 2013, which in turn claims the benefit of priority from French Patent Application No. 12 57101 filed on Jul. 23, 2012, the entirety of which are incorporated herein by reference.

BACKGROUND

Field of the Invention

The present invention relates a process for preparing epitaxial α-quartz layers on a silicon substrate, to the material obtained according to this process, and to its various applications, especially in the electronics field.

Description of Related Art

Quartz is the most abundant mineral in the earth's crust, after feldspar. It is extracted in massive quantities in order to be used in industry in the form of sands and gravel for various applications such as glassmaking, iron production or hydraulic fracturing. However, there is an increasing demand for monocrystalline quartz (α-quartz) in thin layer form. For example, on account of its piezoelectric properties, α-quartz is a material of choice for the manufacture of oscillators present in electronic devices. This property of α-quartz also makes it an excellent transducer for mass sensors, which are widely used in chemistry and biology. Furthermore, α-quartz has other advantageous properties such as optical activity, birefringence, light transparency from the UV range in a vacuum down to the near infrared range and in the terahertz (THz) regions of the spectrum, great hardness and noteworthy chemical durability (P. Shumyatsky, R. R. Alfano, J. Biomed. Opt., 2011, 16, 033001; Doling G., Journal of Physics and Chemistry of Solids, 1979, 40, 121).

Various methods for preparing α-quartz have already been proposed, such as the crystallization of amorphous silica or chemical methods. Among these, the only conventional method for preparing α-quartz is hydrothermal synthesis comprising the growth of a monocrystal on a seed crystal in an alkaline solution of silicon dioxide at high pressure and high temperature, as described especially by R. A. Laudise (J. Chem. Eng. News, 1987, 65(39), 30-43). It is a long and energy-intensive process since the synthesis must be continued for about a month in order to obtain large crystals. Moreover, these processes lead for the most part to incomplete conversion to α-quartz with the presence of other crystalline $SiO_2$ phases, while none of them makes it possible to obtain thin layers. Consequently, the crystals prepared by hydrothermal synthesis must then be cut and polished. These finishing steps entail losses of material which make the process yield fall below 10% and impose a limit on the minimum thickness of the quartz layers, which is about 50 microns.

The problems described above motivated research aimed at preparing thin layers of α-quartz. On the one hand, studies have been directed towards amorphization by bombardment and implantation of ions into quartz crystals and subsequent recrystallization thereof using $^{30}Si^+$ and $^{16}O^+$ ions, (G. Devaud et al. J. Non-Cryst, Solids, 1994, 134, 129-132), alkali metal ions such as $Cs^+$ (F. Roccaforte et al. Appl. Phys. Lett., 1999, 75, 2903-2905), or alternatively Na or Rb (J. Keinonen et al. Appl. Phys. Lett, 2006, 88, 261102). On the other hand, it has already been proposed, especially in U.S. Pat. No. 7,186,295, to prepare epitaxial layers of quartz on sapphire (0001) by chemical vapour deposition at atmospheric pressure catalysed by the presence of gaseous HCl using TEOS.

The preparation of thin layers of quartz was also studied on metal substrates such as Mo(112) (T. Schroeder et al., Surf. Rev. Lett., 2000, 7, 7), Ni(111) (M. Kundu and Y. Murata, Appl. Phys. Lett., 2002, 80, 1921-1923), Pd(100) (Z. Zhang et al., Thin Solid Films, 2008, 516, 3741) or Ru(0001) (D. Löffer et al., Phys. Rev. Lett., 2010, 105, 146104). In these examples, the thickness of the layers does not, however, exceed 5 nm and the technique used, physical deposition under a very high vacuum, is not industrializable at low cost.

Finally, it has been proposed, especially according to the method described in U.S. Pat. No. 6,028,020, to prepare thin layers of crystalline quartz ranging from 0 nm to 50 μm in thickness via a sol-gel route. This process consists, in a first step, in forming on a substrate a layer of a crystalline film of germanium dioxide, and then in forming a monolayer of crystalline quartz on the layer of germanium dioxide previously deposited on the substrate, and finally in separating the layer of crystalline quartz from the substrate by dissolving the layer of germanium dioxide. This method consequently requires the preparation of the substrate by a layer of germanium and then the removal of this preparation layer to recover the layer of crystalline quartz.

OBJECTS AND SUMMARY

There is therefore at the present time no method that affords simple access, without using special equipment or extreme temperature or pressure conditions, to α-quartz in the form of a thin layer whose thickness may range from 5 nm to 50 μm, and in a high yield.

The inventors thus set themselves the aim of providing such a method.

One subject of the present invention is a process for preparing an epitaxial α-quartz layer on a solid support, comprising the following steps:

i) a step of preparing a composition containing, in a solvent, at least one silica and/or colloidal silica precursor;

ii) a step of depositing a layer of the composition obtained above in step i) onto at least part of the surface of a substrate and the formation of an amorphous silica matrix layer;

iii) a step of heat treatment of the amorphous silica matrix layer obtained in step ii) to obtain an epitaxial α-quartz layer, said process being characterized in that:

the substrate is a self-supporting substrate chosen from mono-oriented crystalline silicon, germanium dioxide ($GeO_2$), corundum (α-$Al_2O_3$), magnesium oxide (MgO), strontium titanate ($SrTiO_3$), lithium niobiate ($LiNbO_3$), lithium tantalate ($LiTaO_3$), cerium oxide ($CeO_2$, gadolinium cerium mixed oxides $Ce_{(1-x)}Gd_xO_2$ in which x is such that 0<x<1, lanthanum aluminate ($LaAlO_3$), gallium nitride (GaN), yttrium-doped zirconium dioxide ($ZrO_2$:Y) and gallium orthophosphate ($GaPO_4$), and in that the step of heat treatment of the amorphous silica layer is performed at a temperature of greater than or equal to 800° C., in the presence of at least one catalyst based on one of the following elements in oxidation state (+2): strontium, barium, calcium, magnesium, beryllium, or one of the following elements in oxidation state (+1): caesium, rubidium, lithium, sodium or potassium, or capable of generating one of the following elements in oxidation state (+2): strontium, barium, calcium, magnesium, beryllium, or one of the following elements in oxidation state (+1): caesium, rubidium, sodium, potassium or lithium, said catalyst being present in said amorphous silica matrix.

Such a process is simple, inexpensive and quick to perform. It makes it possible to obtain thin epitaxial α-quartz layers in a high yield and with perfect control of the thickness and of the nanostructure (presence of controllable homogeneous porosity), with a thickness greater than 5 nm and ranging at least up to 50 μm, preferentially up to 10 μm and very preferentially up to 5 μm. The process is also very flexible from a chemical viewpoint insofar as the α-quartz layer may be modified by introducing into the composition surfactants or block polymers to generate porosity or other elements such as ions or pre-synthesized nano-objects in order to increase the functionalities of the material obtained. Finally, a further advantage of the process in accordance with the invention is the use of deposition via a liquid route, which makes the process compatible with micro-scale and nano-scale manufacturing techniques such as lithography by nanoprinting and capillary micromoulding.

In the description that follows, the term "catalyst" is used indiscriminantly to denote catalysts based on the mentioned elements in oxidation state (+2) or (+1) and also catalysts that are capable of generating said elements in oxidation state (+2) or (+1).

According to the invention, the heat treatment step is preferably performed in the presence of oxygen (atmospheric) and, as indicated previously, of a catalyst as defined above which has the effect of catalysing the crystallization of the amorphous silica matrix in α-quartz form. Specifically, the presence of the monocrystalline silicon surface induces growth nucleation of the α-quartz crystals in a single direction corresponding to an epitaxial relationship. In other words, the silicon substrate acts as a nucleation surface on which the growth of the quartz is promoted in an orientation for which the symmetry is similar and the distances separating the rows of atoms are also similar. The result is the production of a layer of mono-oriented polycrystalline quartz, of controllable thickness and nanostructure. The heat treatment step is moreover preferably performed at atmospheric pressure.

According to a first embodiment, the catalyst is present in the composition prepared in step i) and is trapped in the amorphous silica matrix during its formation. In this case, said catalyst preferably represents from 0.2 mol % to 30 mol % relative to the amount of silica and/or colloidal silica precursor, and even more preferentially from 5 mol % to 15 mol %.

According to a second embodiment of the process of the invention, the catalyst is introduced into the amorphous silica matrix at the end of step ii) and before performing the heat treatment step iii). In this case, the amorphous silica matrix layer is impregnated with an impregnation solution containing at least one catalyst as defined previously in a solvent. The concentration of catalyst in said impregnation solution then preferably ranges from 0.2 mol % to 50 mol % and even more preferentially from 5 mol % to 15 mol %.

The catalyst(s) present in the composition prepared in step i) or in the impregnation solution for the amorphous silica matrix layer are preferably salts of divalent cations, i.e. strontium, barium, calcium, magnesium and beryllium salts chosen from the nitrates, sulfates, carbonates, hydroxides, chlorides, acetates, perchlorates, oxides and alkoxides; or alternatively salts of monovalent cations, i.e. caesium, rubidium, sodium, potassium or lithium salts chosen from the nitrates, sulfates, carbonates, hydroxides, chlorides, acetates, perchlorates, oxides and alkoxides.

According to a preferred embodiment of the invention, the catalysts are catalysts based on strontium, calcium or barium and are chosen from strontium nitrates such as $Sr(NO_3)_2$, calcium nitrates such as $Ca(NO_3)_2$ and barium hydroxides such as $Ba(OH)_2$.

The nature of the solvent of the impregnation solution is not critical, provided that it can keep in solution the salt of the catalyst used. By way of example, the solvent of the impregnation solution may be chosen from water and $C_1$-$C_4$ alcohols such as ethanol.

According to the invention, the term "silica precursor" means a compound that is capable of forming silica after a heat treatment at a temperature of greater than or equal to 800° C. It may be chosen from organic, organometallic and mineral compounds comprising silicon. The silica precursor(s) that may be used in the composition prepared in step i) are preferably chosen from silicon alkoxides, silicon tetrachloride, silicates such as ammonium silicate and silicic acid, and mixtures thereof. Among the silicon alkoxides, mention may be made in particular of tetramethoxysilane, tetraethoxyorthosilane (TEOS), (3-mercaptopropyl)-trimethoxysilane, (3-aminopropyl)triethoxysilane, N-(3-trimethoxysilylpropyl)-pyrrole, 3-(2,4-dinitrophenyiamino) propyltriethoxysilane, N-(2-aminoethyl)-3-aminopropylt-rimethoxysilane, phenyltriethoxysilane and methyltriethoxysilane. Among these silicon alkoxides, tetraethoxy orthosilicate is particularly preferred.

Typically, the term "colloidal silica" denotes amorphous silica particles suspended in a solvent. According to the invention, the colloidal silica is preferably chosen from silica particles whose size may range up to 1 μm, generally ranging from 2 to 200 nm and even more preferentially between 7 and 30 nm.

The silica and/or colloidal silica precursor(s) preferably represent from 0.01% to 95% by mass and even more preferentially from 1% to 20% by mass relative to the total mass of the composition prepared in step i).

The solvent for the composition prepared in step i) may be chosen, for example, from water, tower alcohols such as ethanol, methanol and propanol, and mixtures thereof.

Deposition of the composition prepared in step i) onto the substrate may be performed on all or part of the surface of the substrate via any suitable technique, such as via a liquid route, for instance dipping, vaporization or centrifugal coating, or via any other physical or chemical method known to those skilled in the art, among which mention may be made of cathodic sputtering, pulsed laser deposition (PLD), atomic layer deposition (ALD), chemical vapour deposition (CVD), electrochemistry, etc.

According to the invention, the term "part" covers any form of micro-, nano- and macro-structuring of the layer, such as phase separation, breathing figures, lithography, selective dissolution, substrate anodization, dewetting, inkjet printing, surface structuring with amphiphilic agents or deposition of latex beads, pad printing or any other direct or indirect surface structuring method known to those skilled in the art, which is capable of generating substrate zones covered with composition and zones free of composition.

The composition prepared in step i) may also contain one or more additives such as pH regulators (for example HCl), structuring or modifying agents, or alternatively porosity promoters such as polymers, quaternary ammoniums and urea.

During step ii), the formation of the amorphous silica matrix layer may be obtained by evaporating the solvent from the composition prepared in step i), and brings about condensation of the silica precursors. This evaporation may be performed at room temperature or at a higher temperature that may be up to 700° C., so as to accelerate the evaporation of the solvent and thus the formation of the amorphous silica matrix layer. Also, during step ii), and when the composition prepared in step i) comprises colloidal silica, the evaporation of the solvent brings about stacking of the colloids in the form of a layer that is capable of generating the amorphous silica, layer during the heat treatment ranging up to 700° C.

According to a preferred embodiment of the invention, the heat treatment step iii) is performed at a temperature ranging from 800 to 1200° C. and even more preferentially at a temperature of about 1000° C.

The duration of the heat treatment step may be chosen as a function of the thickness of the α-quartz layer that it is desired to obtain, the thickness being proportionately greater the longer the duration of the heat treatment step. Thus, and by way of example, when it is desired to obtain a thickness from about 150 nm to 700 nm, the duration of the heat treatment step may range from 2 to 10 hours approximately, and when it is desired to obtain thicknesses greater than 700 nm, then the duration of the heat treatment step may exceed 24 hours.

The thickness of the quartz layer also depends on the thickness of the layer of the composition deposited on the substrate during step i).

It is also possible to repeat steps i) to iii) one or more times on the same substrate so as to form successive quartz layers superposed one on the other, or else on different zones of the same substrate.

The substrate is preferably a mono-oriented crystalline silicon substrate. In this case, and according to a particular embodiment of the invention, the silicon substrate may comprise a layer of native amorphous $SiO_2$ onto which is deposited the composition prepared in step i) so as to promote the crystallization of the amorphous silica matrix and the formation of α-quartz.

According to a particular and preferred embodiment of the invention, the process is a sol-gel process, in which:

the composition used in step i) is a sol-gel composition containing, in a solvent, at least one silica precursor, the formation of the amorphous silica, matrix layer on the surface of the substrate is performed by evaporating the solvent contained in the sol-gel composition, the substrate is a mono-oriented crystalline silicon substrate, the step of heat treatment of the silica layer is performed in the presence of oxygen and at atmospheric pressure, and the catalyst is a catalyst based on strontium, barium or calcium in oxidation state (+2) or which is capable of generating strontium, barium or calcium in oxidation state (+2).

According to this particular and preferred embodiment of the invention, the catalyst that is most particularly preferred is a catalyst based on strontium or barium in oxidation state (+2) or which is capable of generating strontium or barium in oxidation state (+2).

In this case, and when the catalyst is present in the sol-gel composition prepared in step i), then it may also contain one or more surfactants so as to give the final α-quartz layer nano- or micro-structuring. Specifically, during the evaporation of the sol-gel composition at the surface of the silicon substrate, phase separation takes place between a silica-rich phase and a catalyst-rich second phase, stabilized by the presence of the surfactant. During the heat treatment, the silica-rich phase becomes converted into epitaxial α-quartz. The rest of the treatment makes it possible to transfer to the silicon substrate the structure formed by the phase separation. Without wishing to be bound by any theory, the inventors think that the mechanism which is at the origin of this replication probably proceeds via a surface oxidation of the silicon to $SiO_2$, followed by its conversion into α-quartz under the quartz crystals already formed by means of the presence of the catalyst in the cavities and the diffusion of oxygen through these same cavities. Thickening of the layer may thus be envisaged via the gradual consumption of the silicon substrate.

The surfactant(s) that may be used in this case may be chosen from cationic surfactants especially such as tetradecyltrimethylammonium bromide (TTAB), dodecyltrimethylammonium bromide or cetyltrimethylammonium bromide (CTAB). Cetyltrimethylammonium bromide is particularly preferred according to the invention.

The surfactant may also be an anionic surfactant chosen from sodium dodecyl sulfate, sodium dodecylsulfonate and sodium dioctyisulfosuccinate (AOT). Finally, the surfactant compound may be a nonionic surfactant chosen from ethoxyl-headed surfactants, and nonylphenols. Among such surfactants, mention may be made in particular of block copolymers of ethylene glycol and of propylene glycol such as those sold, for example, under the trade names Pluronic® P123 and Pluronic® F127 by the company BASF.

A subject of the invention is also the material obtained by performing the process as defined above, said material being characterized in that it comprises a self-supporting substrate chosen from mono-oriented crystalline silicon, germanium dioxide, corundum, magnesium oxide, strontium titanate, lithium niobiate, lithium tantalate, cerium oxide, gadolinium cerium mixed oxides of formula $Ce_{(1-x)}Gd_xO_2$ in which x is such that $0<x<1$, lanthanum aluminate, gallium nitride, yttrium-doped zirconium dioxide and gallium orthophosphate, said support comprising, on at least part of its surface, an epitaxial layer consisting of mono-oriented polycrystalline α-quartz comprising mesopores and/or macropores.

According to the invention, the dimension of the mesopores may range from 2 to 50 nm and in particular from 15 to 50 nm, and the dimension of the macropores may range from >50 nm to 1000 nm and preferably from 200 to 500 nm.

The thickness of the epitaxial layer may range from 2 nm up to 50 μm, preferentially up to 10 μm and very preferentially from 5 nm to 5 μm approximately.

Due to the intrinsic piezoelectric properties of α-quartz and to the possibility offered by the preparation process in accordance with the invention, which makes it possible to prepare it as a thin layer on a substrate as defined previously, and in particular on a silicon substrate, the material as defined above may be used in industry in several technological fields.

A subject of the invention is also the use of a material obtained according to the process as defined previously:

as a piezoelectric component, especially in an electronic device, for manufacturing oscillators, as a specific filter for mechanical waves and for transducing mechanical waves into electromagnetic waves, for manufacturing accelerometers and angular velocity pickups, or for manufacturing mass sensors.

Needless to say, a person skilled in the art will select the nature of the substrate as a function of the envisaged application, certain applications requiring, for example, an electrically conductive substrate or phonon-propagating properties different from those of the epitaxial layer.

Moreover, α-quartz is transparent to visible light and to UV. The material in accordance with the invention and obtained according to the process as defined previously may thus be used for the manufacture of lenses and waveguides in the visible or UV wavelength field.

The very high chemical resistance of α-quartz may be exploited. Thus, the process as defined previously may be used for the preparation of a protective layer at the surface of silicon in situations in which the silicon is greatly solicited by frictions or abrasion or aggressive chemical environments.

The material in accordance with the invention may also be used as an electrical insulator. This property might be used for the manufacture of various electronic devices in which an insulating layer is required, for instance in tunnel junctions. The advantage over an insulating layer of another nature is the piezo-electricity of the material that may be used in this case as an additional device control variable, making it possible to vary the thickness of the barrier and thus the intensity of the tunnel currents.

Finally, the material in accordance with the invention may be used as an epitaxial substrate. Specifically, the crystallinity of quartz may prove to be beneficial to the epitaxial growth of certain crystals of biological interest.

DETAILED DESCRIPTION

The present invention is illustrated by the following implementation examples, to which it is, however, not limited.

EXAMPLES

Starting Materials Used in the Examples:
98% tetraethoxyorthosilane (TEOS): Sigma-Aldrich company,
ethanol (EtOH),
hydrochloric acid (HCl),
strontium nitrate ($Sr(NO_3)_2$): Sigma-Aldrich company,
barium hydroxide ($Ba(OH)_2$): Sigma-Aldrich company,
cetyltrimethylammonium bromide (CTAB): Sigma-Aldrich company,
polyethylene glycol monohexadecyl ether sold under the trade name Brij-56® by the Sigma-Aldrich company.

Example 1

Preparation of an α-Quartz Layer According to the Process of the Invention

A precursor solution having the following initial (molar) composition was prepared: 1TEOS, 25EtOH, $5H_2O$, 0.18HCl, $0.062Sr(NO_3)_2$.

Deposition of the precursor solution was performed on a silicon substrate (Si(100)) (dimensions: 0.7 mm thick and area of 3 cm×5 cm) comprising a layer of native $SiO_2$ 2.2 mm thick by dipping and withdrawal in dry air at room temperature, at a rate of 2 mm·s$^{-1}$.

After depositing the precursor solution, the silicon substrate was subjected to the following heat treatment in a tubular oven, under air and at atmospheric pressure: temperature rise from room temperature to 1000° C. at a rate of 3° C./min, followed by maintenance at 1000° C. for 5 hours.

The oven was then switched off and the substrate was allowed to cool to 25° C. at a rate of 3° C./min.

A silicon (1 0 0) support covered, with a layer of α-quartz was obtained, and was then characterized.

The thickness and refractive index measurements were taken by ellipsometry using a spectroscopic ellipsometer sold under the trade name 2000U Woollam by the company VASE or by scanning electron microscopy-field emission (SEM-FE) with an SU6600 scanning electron microscope from the company Hitachi.

The dimensions, the roughness and the appearance of the crystals were determined using an atomic force microscope (AFM) sold by the company Veeco and an optical microscope.

The epitaxy was determined by wide-angle x-ray scattering via a diffractometer sold under the trade name GADDS D8 in Brüker mounting, copper irradiation 1.54056 Å.

The α-quartz layer thus obtained had a thickness of 180 nm and a refractive index of 1.545, which is very close to the refractive index of dense quartz (1.55 at λ=700 nm).

Figure 1:
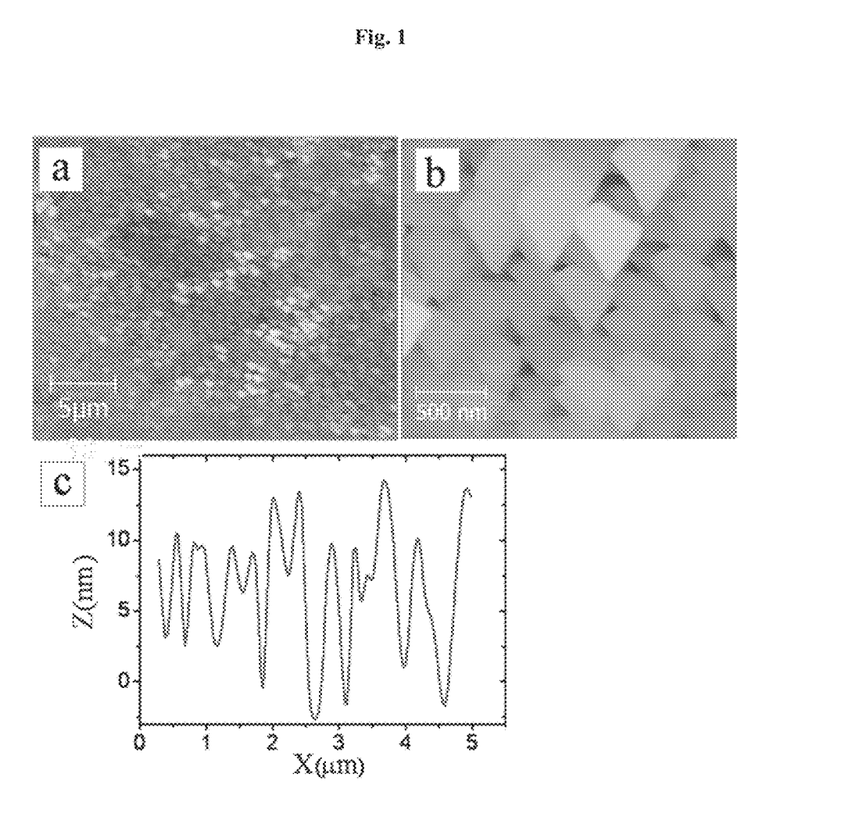
FIGS. 1a and 1b are the AFM images of the surface of the α-quartz layer and FIG. 1c shows the curve of the AFM analysis of the surface profile of the layer, from example 1, in accordance with one embodiment.

The attached FIG. 1 gives the results of the topographic study of the epitaxial dense layer of α-quartz thus obtained: FIGS. 1a and 1b are the AFM images of the surface of the α-quartz layer and FIG. 1c shows the curve of the AFM analysis of the surface profile of the layer (height Z in nm as a function of the length X in μm).

It emerges from FIGS. 1a and 1b that the quartz polycrystals have a lateral dimension ranging from 450 nm to 500 nm.

The image of the AFM profile (FIG. 1c) shows that the quartz layer obtained has very good homogeneity: perfect optical quality and low roughness (RMS=8 nm).

Figure 2:
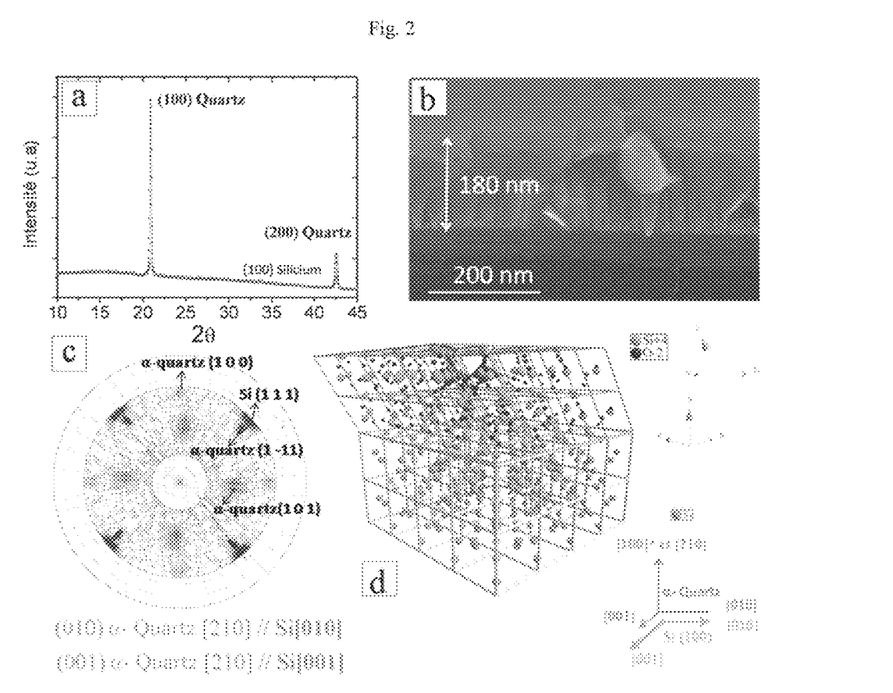
FIGS. 2a-2d and 3a-3d show the results of the structural and microstructural study of the quartz layer obtained in example 1, in accordance with one embodiment.
Figure 3:
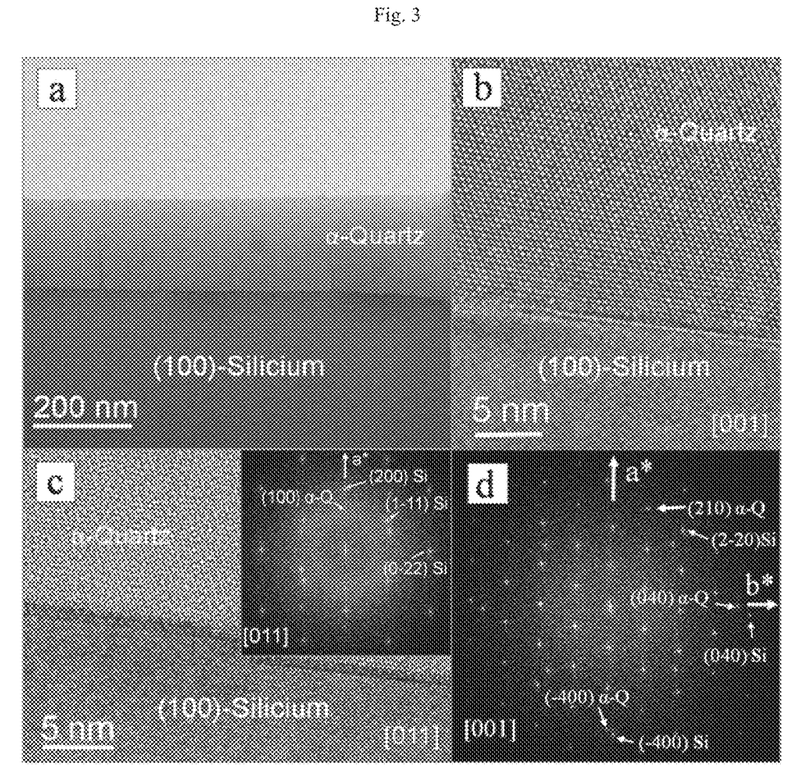

The results of the structural and microstructural study of the quartz layer obtained are given, respectively, by the attached FIGS. 2 and 3.

FIG. 2a shows the XRD spectrum (intensity in arbitrary units as a function of the angle 2θ in degrees); FIG. 2b is the SEM microscopy image of the vertical section of the quartz layer; FIG. 2c is a pole figure: α-quartz (1 0 0) 2θ=20.8°, χ: 50°, φ: 0°; silicon substrate (1 1 1) χ: 60°, φ: 45° 2θ=28.7°; α-quartz (1 0 1) χ: 58°, φ: 45° 2θ=26.8°; α-quartz (1 0 1) χ: 36°, φ: 0°, 2θ=26.8; and FIG. 2d is a model of two-dimensional representation of the orientation of the epitaxial dense layer of α-quartz.

FIG. 3a shows a TEM image at low magnification (in bright-field mode) of the cross section of a quartz layer on a silicon substrate oriented along the crystallographic direction (100). FIGS. 3b, c and d show high-resolution TEM images of the quartz-silicon interface across the axes of crystallographic zones [001] and [011] of α-quartz, respectively. The framed figure in FIG. 3c shows the Fourier transform (FFT) of the image of METHR 3c. FIG. 3d shows the FFT of FIG. 3b which confirms the epitaxial relationship between quartz and silicon.

Example 2

Preparation of an α-Quartz Layer According to the Process of the Invention (Impregnation of a Mesoporous Layer of Amorphous Silica with Barium ($Ba^{2+}$) Salts)

In this example, it is shown that the impregnation of a mesoporous layer of amorphous silica with a solution containing barium $Ba^{2+}$ makes it possible to form an α-quartz layer.

A silica precursor solution having the following initial (molar) composition was prepared: 1TEOS, 25EtOH, $5H_2O$, 0.18HCl, 0.05 Brij-56.

Deposition of the solution was performed on a silicon substrate (Si(100)) (dimensions: 0.7 mm thick and area of 3 cm×5 cm) comprising a layer of native $SiO_2$ 2.2 mm thick by dipping and withdrawal in dry air at room temperature, at a rate of 2 mm·$s^{-1}$.

After deposition of the silica precursor solution, the silicon substrate was subjected to the following heat treatment in an open oven under air and at atmospheric pressure: 5 minutes at 500° C.

A silicon (100) support covered with a layer of mesoporous amorphous silica 60 mm thick and comprising pores of about 3 nm interconnected in a 3D network was obtained.

Following the formation of the silica sol-gel mesoporous layer, the porosity was impregnated with a 1M solution of barium hydroxide $Ba(OH)_2$ in acetic acid.

The impregnation was performed by dipping and withdrawal in dry air at room temperature, at a rate of 2 mm·$s^{-1}$.

The silicon substrate was then subjected to the following heat treatment in a tubular oven, under air and at atmospheric pressure: temperature rise from room temperature to 1000° C. at a rate of 3° C./min, for 5 hours.

The oven was then switched off and the substrate was allowed to cool to 25° C. at a rate of 3° C./min.

A silicon (100) support covered with an α-quartz layer was obtained, and was then characterized (thickness, refractive index and epitaxy) as described above in Example 1.

The α-quartz layer thus obtained had a thickness of 235 nm and a refractive index of 1.52, which is very close to the refractive index of dense quartz (1.55 at λ=700 nm).

Figure 4:
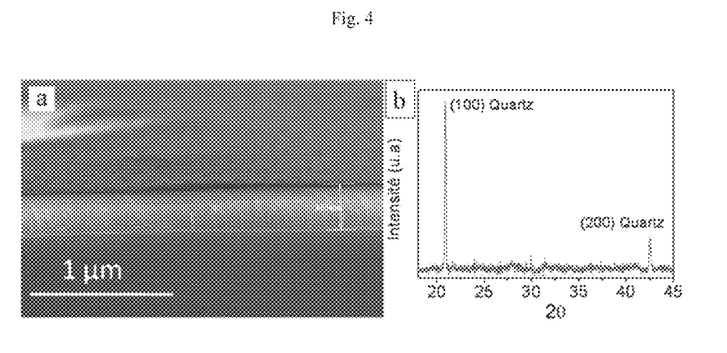
FIGS. 4a and 4b gives the results of the study of the thickness of the epitaxial α-quartz dense layer from example 2, in accordance with one embodiment.

The attached FIG. 4 gives the results of the study of the thickness of the epitaxial α-quartz dense layer thus obtained: FIG. 4a is the SEM microscopy image of the cross section of the quartz layer, FIG. 4b is the image of the XRD spectrum (intensity given in arbitrary units as a function of the angle 2θ in degrees).

Example 3

Preparation of a Structured α-Quartz Layer According to the Process of the Invention In this example, it is shown that the presence of a cationic surfactant in the precursor solution enables micro- or nano-structuring of the epitaxial α-quartz layer. Specifically, during the evaporation of the precursor solution at the surface of the silicon substrate, phase separation takes place between a silica-rich phase and a strontium-rich second phase, stabilized by the presence of a surfactant such as CTAB. During the heat treatment, the silica-rich phase becomes converted into epitaxial quartz. Alternatively, a longer heat treatment makes it possible to transfer to the Si substrate the structure formed by phase separation (formation of pores). Without wishing to be bound by any theory, the inventors suppose that the mechanism which is at the origin of this replication probably proceeds via a surface oxidation of the Si to $SiO_2$, followed by its conversion into quartz under the quartz crystals already formed by means of the presence of the catalyst in the cavities and of the diffusion of oxygen through these same cavities. However, this mechanism remains to be confirmed. Thickening of the layer is thus envisaged by the gradual consumption of the silicon substrate.

A precursor solution having the following initial (molar) composition was prepared: 1TEOS, 25EtOH, $5H_2O$, 0.18HCl, 0.114CTAB 0.062$Sr(NO_3)_2$.

Deposition of the quartz layer was then performed under exactly the same conditions as those of Example 1 above, it being understood that the heat treatment was performed over a period of 5 hours, and also over a period of 20 hours.

The structured (porous) quartz layers have the same characteristics (crystal size, orientation, thickness) as the dense layers apart from the presence of the pores. The pure quartz layer has cavities of homogeneous diameters relatively well dispersed over the surface, derived from the phase separation.

Figure 5:
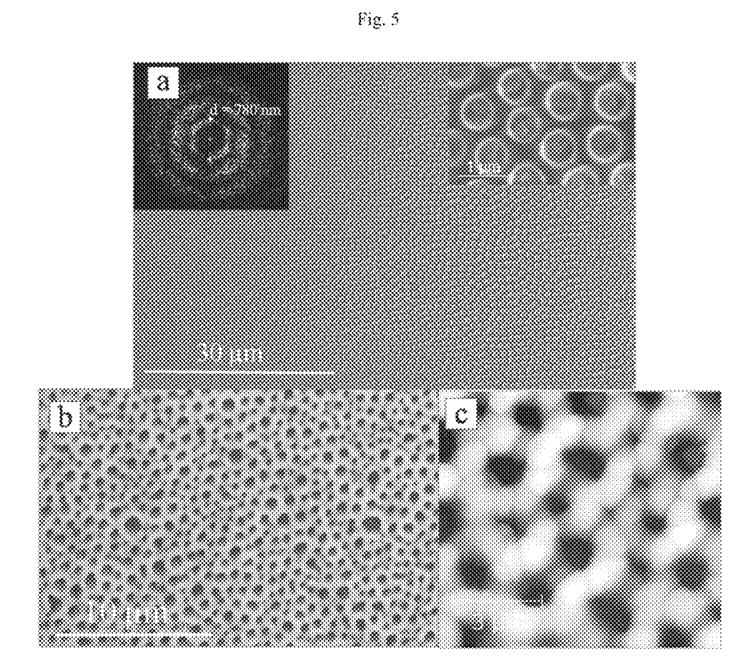
FIGS. 5a-5c and 6a-6d show the images of the porous quartz layer of example 3, in accordance with one embodiment.
Figure 6:
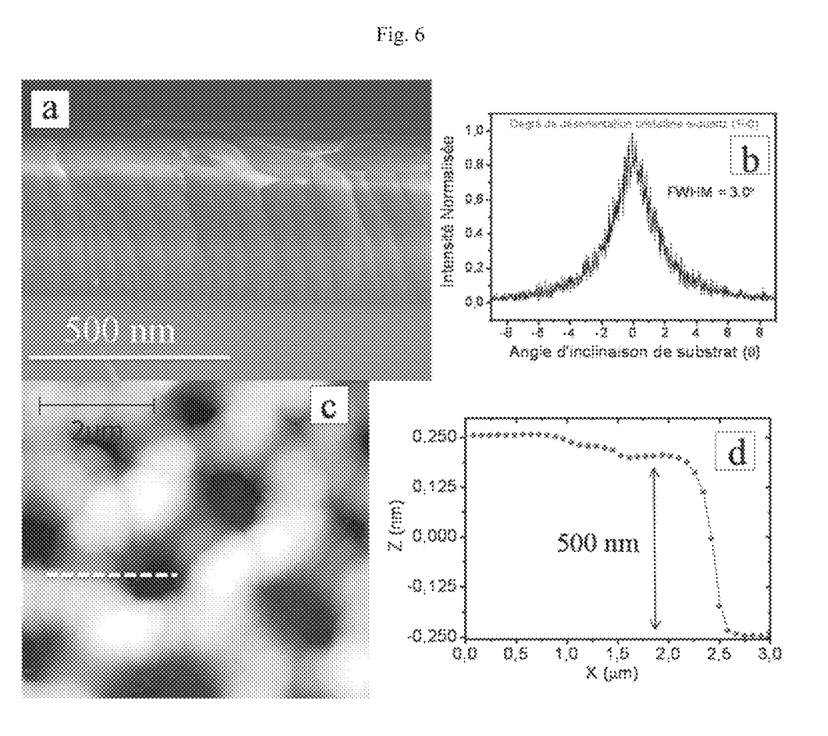

FIGS. 5 and 6 show the images of the porous quartz layer thus obtained.

FIG. 5a is an image taken by SEM and shows the appearance of the layer before heat treatment. The phase segregation which gave rise to a nanoporous layer of amorphous silica with pores 780 nm in diameter and hexagonal stacking is observed. FIGS. 5b and 5c are AFM microscopy images.

FIG. 6a is an SEM image of the cross section of the epitaxial α-quartz porous layer; FIG. 6b gives the XRD spectrum (intensity in arbitrary units as a function of the angle 2θ in degrees); FIG. 6c shows the AFM microscopy image of the epitaxial quartz porous layer and FIG. 6d gives the analysis of the thickness profile of the layer (height Z in nm as a function of the length X in μm).

The characteristics of the epitaxial α-quartz layer thus obtained were as follows:
thickness of the layer after 5 hours of heat treatment (ellipsometry)=250 nm,
thickness of the layer after 20 hours of heat treatment (ellipsometry)=500 nm (cf. electron microscopy image, FIG. 6a and profile of the AFM microscope FIG. 6d),
lateral dimension of the crystals: 40 nm (cf. electron microscopy image, FIG. 5a),
lateral dimension of the nanopores: 200-500 nm (cf. electron microscopy image and AFM, FIG. 5c),
epitaxy: (100) (cf. XRD spectrum, FIG. 6b).

The invention claimed is:
1. Process for preparing an epitaxial α-quartz layer on a solid support, comprising the following steps:
  i) a step of preparing a composition containing, in a solvent, at least one silica and/or colloidal silica precursor;
  ii) a step of depositing a layer of the composition obtained above in step i) onto at least part of the surface of a substrate and the formation of an amorphous silica matrix layer;

iii) a step of heat treatment of the amorphous silica matrix layer obtained in step ii) to obtain an epitaxial α-quartz layer, wherein:

the substrate is a self-supporting mono-oriented crystalline silicon substrate comprising a layer of native amorphous $SiO_2$, and in that the step of heat treatment of the amorphous silica layer is performed at a temperature of greater than or equal to 800° C., in the presence of at least one catalyst based on one of the following elements in oxidation state (+2): strontium, barium, calcium, magnesium, beryllium, or one of the following elements in oxidation state (+1): caesium, rubidium, lithium, sodium or potassium, or capable of generating one of the following elements in oxidation state (+2): strontium, barium, calcium, magnesium, beryllium, or one of the following elements in oxidation state (+1): caesium, rubidium, sodium, potassium or lithium, said catalyst being present in said amorphous silica matrix.

2. Process according to claim 1, wherein the heat treatment step is performed in the presence of oxygen.

3. Process according to claim 1, wherein the catalyst is present in the composition prepared in step i) and represents from 0.2 mol % to 30 mol % relative to the silica precursor and/or the colloidal silica precursor.

4. Process according to claim 1, wherein the catalyst is introduced into the amorphous silica matrix at the end of step ii) and before performing the heat treatment step iii) and the amorphous silica matrix layer is impregnated with an impregnation solution containing at least said catalyst in a solvent.

5. Process according to claim 4, wherein the concentration of catalyst in said impregnation solution ranges from 0.2 mol % to 50 mol %.

6. Process according to claim 1, wherein the catalyst(s) present in the composition prepared in step i) or in the impregnation solution for the amorphous silica matrix layer are strontium, barium, calcium, magnesium or beryllium salts, chosen from the nitrates, sulfates, carbonates, hydroxides, chlorides, acetates, perchlorates, oxides and alkoxides.

7. Process according to claim 1, wherein the catalyst(s) present in the composition prepared in step i) or in the impregnation solution for the amorphous silica matrix layer are caesium, rubidium, sodium, potassium or lithium salts chosen from the nitrates, sulfates, carbonates, hydroxides, chlorides, acetates, perchlorates, oxides and alkoxides.

8. Process according to claim 1, wherein the silica precursor(s) that may be used in the composition prepared in step i) are chosen from silicon alkoxides, silicon tetrachloride, silicates and silicic acid, and mixtures thereof.

9. Process according to claim 8, wherein the silicon alkoxides are chosen from tetramethoxysilane, tetraethoxyorthosilane, (3-mercaptopropyl)-trimethoxysilane, (3-aminopropyl)triethoxysilane, N-(3-trimethoxysilylpropyl)pyrrole, 3-(2,4-dinitrophenylamino)propyltriethoxysilane, N-(2-aminoethyl)-3-aminopropyltrimethoxysilane, phenyltriethoxysilane and methyltriethoxysilane.

10. Process according to claim 1, wherein the silica and/or colloidal silica precursor(s) represent from 0.01% to 95% by mass relative to the total mass of the composition prepared in step i).

11. Process according to claim 1, wherein the composition prepared in step i) also contains one or more additives chosen from pH regulators, structuring or modifying agents, and porosity promoters.

12. Process according to claim 1, wherein the heat treatment step iii) is performed at a temperature ranging from 800 to 1200° C.

13. Process according to claim 1, wherein steps i) to iii) are repeated one or more times on the same substrate so as to form successive quartz layers superposed one on the other, or else on different zones of the same substrate.

14. Process according to claim 1, wherein the process is a sol-gel process in which:

the composition used in step i) is a sol-gel composition containing, in a solvent, at least one silica precursor, the formation of the amorphous silica matrix layer on the surface of the substrate is performed by evaporating the solvent contained in the sol-gel composition, the substrate is a mono-oriented crystalline silicon substrate, the step of heat treatment of the silica layer is performed in the presence of oxygen and at atmospheric pressure, and the catalyst is a catalyst based on strontium, barium or calcium in oxidation state (+2) or which is capable of generating strontium, barium or calcium in oxidation state (+2).

15. Process according to claim 14, wherein the catalyst is a catalyst based on strontium or barium in oxidation state (+2) or capable of generating strontium or barium in oxidation state (+2).

16. Process according to claim 14, wherein the catalyst is present in the composition prepared in step i), and said composition also contains one or more surfactants.

17. Process according to claim 16, wherein the surfactant(s) are chosen from cationic surfactants chosen from tetradecyltrimethylammonium bromide, dodecyltrimethylammonium bromide and cetyltrimethylammonium bromide; anionic surfactants chosen from sodium dodecyl sulfate, sodium dodecylsulfonate and sodium dioctylsulfosuccinate; and nonionic surfactants chosen from block copolymers of ethylene glycol and of propylene glycol.

* * * * *

UNITED STATES PATENT AND TRADEMARK OFFICE
CERTIFICATE OF CORRECTION

PATENT NO. : 10,053,795 B2
APPLICATION NO. : 14/416098
DATED : August 21, 2018
INVENTOR(S) : Boissiere et al.

Page 1 of 1

It is certified that error appears in the above-identified patent and that said Letters Patent is hereby corrected as shown below:

On the Title Page

Item (73) Assignee, should read:
(73) Assignee  CENTRE NATIONAL DE LA RECHERCHE SCIENTIFIQUE, Paris (FR);
CONSEJO SUPERIOR DE INVESTIGACIONES CIENTIFICAS (CSIC), Madrid (ES);
UNIVERSITE PIERRE ET MARIE CURIE (PARIS 6), Paris (FR)

Signed and Sealed this
Fourth Day of December, 2018

Andrei Iancu
*Director of the United States Patent and Trademark Office*